United States Patent [19]

Uno et al.

[11] Patent Number: 5,049,435

[45] Date of Patent: Sep. 17, 1991

[54] FLEXIBLE SHEET REINFORCED WITH POLY(AROMATIC AMIDE) NON-WOVEN FABRIC AND USE THEREOF

[75] Inventors: Keiichi Uno, Shiga; Yoshimi Ishinami, Iwakuni; Masaaki Nakamura, Otsu; Tomohiko Nakao, Iwakuni, all of Japan

[73] Assignee: Toyo Boseki Kabushiki Kaisha, Osaka, Japan

[21] Appl. No.: 415,959

[22] Filed: Oct. 2, 1989

Related U.S. Application Data

[63] Continuation of Ser. No. 821,304, Jan. 22, 1986, Pat. No. 4,897,301.

[30] Foreign Application Priority Data

Jan. 23, 1985 [JP] Japan .................................. 60-11499
Feb. 4, 1985 [JP] Japan .................................. 60-19480
Jun. 21, 1985 [JP] Japan ................................ 60-136287

[51] Int. Cl.$^5$ ..................... B32B 15/08; B32B 27/02; B32B 27/34; H05K 1/03
[52] U.S. Cl. .................................. 428/209; 174/254; 428/285; 428/287; 428/290; 428/340; 428/458; 428/475.2; 428/901; 428/902; 428/920
[58] Field of Search ............... 428/209, 285, 287, 290, 428/340, 458, 475.2, 901, 902, 920; 174/68.5

[56] References Cited

U.S. PATENT DOCUMENTS

| | | | |
|---|---|---|---|
| 3,878,316 | 4/1975 | Groff | 174/68.5 |
| 3,956,561 | 5/1976 | Anderson | 428/901 |
| 4,120,914 | 10/1978 | Behnke | 524/115 |
| 4,198,494 | 4/1980 | Burckel | 525/432 |
| 4,443,517 | 4/1984 | Shah | 428/901 |
| 4,446,191 | 4/1984 | Miyadera | 428/285 |
| 4,464,429 | 5/1984 | Michaud-Soret | 428/902 |
| 4,486,494 | 12/1984 | Eldin | 428/902 |
| 4,501,787 | 2/1985 | Marchetti | 428/901 |
| 4,532,275 | 7/1985 | Aito | 428/902 |
| 4,548,678 | 10/1985 | Laflin | 428/902 |
| 4,590,539 | 5/1986 | Sanjana | 428/902 |
| 4,623,577 | 11/1986 | Hsiue | 428/209 |
| 4,750,443 | 6/1988 | Blaustein | 428/420 |
| 4,897,301 | 1/1990 | Uno et al. | 428/209 |

FOREIGN PATENT DOCUMENTS

2600209 7/1976 Fed. Rep. of Germany.

OTHER PUBLICATIONS

Chemical Abstracts 93:214369W.
Research Disclosure, Item 22215, "Lightweight Aramid Nonwovens for Thermal Protection" pp. 345–346 (Oct. 1982).

*Primary Examiner*—James C. Cannon

[57] ABSTRACT

A flexible sheet which comprises a non-woven fabric made predominantly from a poly(aromatic amide) component which is impregnated with a heat- and/or light-curable resin, wherein the non-woven fabric satisfies the following conditions:

5 g/m$^2$ < weight per unit area < 35 g/m$^2$, and
0.15 g/cm$^3$ ≦ density ≦ 0.8 g/cm$^3$, which has well balanced properties, such as excellent heat dimensional stability, heat resistance (soldering resistance), water resistance, solvent resistance, electrical insulating properties and mechanical properties and is useful for the preparation of a flexible printed circuit board, and use thereof for a flexible metal-clad laminate and a flexible printed circuit board.

8 Claims, No Drawings

FLEXIBLE SHEET REINFORCED WITH POLY(AROMATIC AMIDE) NON-WOVEN FABRIC AND USE THEREOF

This is a continuation of copending application Ser. No. 821,304, filed on Jan. 22, 1986, now U.S. Pat. No. 4,897,301.

The present invention relates to a flexible sheet reinforced with a poly(aromatic amide) non-woven fabric and use thereof. More particularly, it relates to a flexible sheet reinforced with a poly(aromatic amide) non-woven fabric which has excellent heat dimensional stability and soldering resistance, said flexible sheet having electrical insulating properties and mechanical properties and being prepared by impregnating a heat and/or light curable resin into a non-woven fabric: a flexible metal-clad laminate which is prepared by laminating a metallic layer onto the flexible sheet; and a flexible printed circuit board wherein the flexible sheet is used as a base sheet and/or as a covering layer.

PRIOR ART

Printed circuit boards are generally prepared by laminating a metal foil such as a copper foil onto a plastic insulating base board with or without an intermediate layer of an adhesive having a heat resistance and forming a circuit pattern on the metal foil by etching method. Among these printed circuit boards, demand for flexible printed circuit board is increased in view of necessity of miniaturization, lightweight, thin thickness and high density of the circuits. In the present specification, the term of the flexible printed circuit board is used in broad sense including a flat cable and a carrier tape for integrating circuit tip.

As a material for the base material of the flexible printed circuit boards and of the film for a covering layer, there have hitherto predominantly been used polyethylene terephthalate films and polyimide films, and there have occasionally been used glass cloth-reinforced epoxy resin sheets and poly(aromatic amide)-made papers.

Although the polyester films have excellent mechanical properties, electrical properties and chemical resistance, they are unsatisfactory in the heat resistance, and hence, when they are heated at 200° to 230° C. at the soldering step, they show undesirable large shrinkage, which causes restriction in usage. Besides, although the polyimide films have excellent mechanical properties and heat resistance, they show less water resistance, and hence, during the lamination step and soldering step, it is required to control the moisture, and sometimes the products show decreased electrical properties. These films are also disadvantageous in the high cost. The glass cloth-reinforced epoxy resin sheets have excellent electrical insulating properties, chemical resistance and water resistance, but they have fatal defect of extremely low flexibility which is required in flexible printed circuit board. There has sometimes been used a film-like paper made from a poly(aromatic amide) (e.g. Normex ® Paper, manufactured by DuPont) instead of the above films, but such a paper is unsatisfactory in practical viewpoint because of less water resistance and dimensional stability.

The conventional boards made from curable resins such as unsaturated polyester, epoxy resin and phenol resin with reinforcing materials such as glass-cloth and cellulose paper have comparatively high mechanical properties and toughness, but they have no flexibility, and hence, they can not be used for flexible printed circuit board and carrier tape.

BRIEF SUMMARY OF THE INVENTION

The present invention provides a new type of flexible sheet, metal laminated sheet and printed circuit board which have improved properties. That is, an object of the present invention is to provide a flexible sheet reinforced with a poly(aromatic amide) non-woven fabric which has excellent heat dimensional stability, soldering resistance, electrical insulating properties and mechanical properties. Another object of the invention is to provide a flexible metal laminated sheet which has also excellent heat dimensional stability, water resistance and soldering resistance. A further object of the invention is to provide a flexible printed circuit board having excellent heat dimensional stability, soldering resistance, electrical insulating properties and mechanical properties. These and other objects and advantages of the invention will be apparent to those skilled in the art from the following description.

DETAILED DESCRIPTION OF THE INVENTION

The flexible sheet of the present invention comprises a non-woven fabric made predominantly from a poly(aromatic amide) component which is impregnated with a heat- and/or light-curable resin, wherein the non-woven fabric satisfies the following conditions:

$5 \text{ g/m}^2 <$ weight per unit area $< 35 \text{ g/m}^2$, and $0.15 \text{ g/cm}^3 \leq$ density $\leq 0.8 \text{ g/cm}^3$ In the non-woven fabric made predominantly from a poly(aromatic amide) component, the kind of the poly(aromatic amide) (hereinafter referred to as "aramide") is not specified but is preferably composed of the following unit:

$$-HN-R_1-NHOCR_2CO-, \quad \text{formula (1)}$$

or $$-HN-R_3-CO- \quad \text{formula (2)}$$

wherein $R_1$, $R_2$ and $R_3$ are each a substituted or unsubstitued aromatic group, and include particularly the following groups:

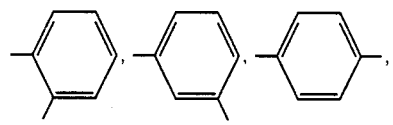

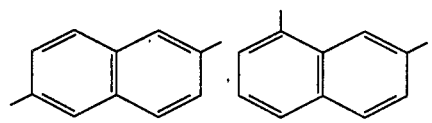

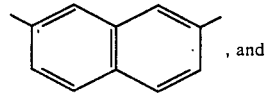, and

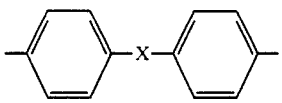

wherein X is —O—, —S—,

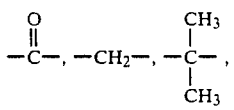

etc., and the substituent on the aromatic group is a member selected from the group consisting of an alkyl having 1 to 3 carbon atoms, chlorine atom, bromine atom, and phenyl.

The aramide used in the present invention include poly(aromatic amide) having the structural unit of the formula (1) or (2) as mentioned above, which includes homopolymers and copolymers, and is preferably poly(-metaphenylene isophthalamide) and poly(para-phenylene terephthalamide).

The non-woven fabric made predominantly from an aramide component (hereinafter referred to as "aramide nonwoven fabric") contains 60% by weight or more, preferably 70% by weight or more, most preferably 90% by weight or more, of an aramide. The aramide component comprises aramide chopped fibers and an optional aramide binder, for example, aramide fibrous binder (usually aramide fibrids). The aramide chopped fibers are usually in a fiber fineness of 0.5 to 10 deniers and a cutting length of 3 to 100 mm, preferably 5 to 80 mm.

The components other than aramide in the non-woven fabric are optional and maybe a binder other than the aramide fibrous binder, chopped fibers of other synthetic resins, glass-made chopped fibers, ceramic chopped fibers, etc. as mentioned below. The binder other than the aramide fibrous binder includes a fibrous binder of a thermoplastic polymer having a heat resistance (e.g. polyesters such as polyethylene terephthalate: polyamides such as 6,6-nylon: 6-nylon: polysulfones: polyphenylene sulfides, etc.). There may also be used conventional water-soluble or water-dispersible binders, powdery binders, and solvent-soluble binders which have usually been used as a binder for synthetic fiber non-woven fabric and paper.

The aramide non-woven fabric (including paper) can be prepared by both of a dry process and a wet process. The dry process includes a curd system and an air system, and the wet process is a usual process using a paper machine.

The binding of the poly(aromatic amide) fibers in the non-woven fabric may be any one of a mechanical binding or a binding with a binder, but the binding with a binder is preferable in view of obtaining a thin non-woven fabric.

The aramide non-woven fabric used in the present invention has a weight per unit area of 5 g/m²–35 g/m², preferably 15 g/m²–30 g/m². When it is less than 5 g/m², the non-woven fabric shows inferior workability in papering step and impregnating step and shows insufficient effect in the reinforcing the sheet. On the other hand, when it is over 35 g/m², the sheet obtained by the impregnating of a resin has too thick thickness, and hence, the flexible printed circuit board prepared therefrom shows disadvantageously inferior flexing resistance.

The aramide non-woven fabric used in the present invention has an apparent density of 0.15 g/cm³ to 0.8 g/cm³. When it is less than 0.15 g/cm³, the non-woven fabric has too high impregnating amount of a resin, and hence, the flexible printed circuit board prepared therefrom shows disadvantageously lower folding endurance. On the other hand, when it is over 0.8 g/cm³, the non-woven fabric has less impregnation of a resin and tends to have foams within the sheet, and hence, the flexible printed circuit board prepared therefrom shows disadvantageously less electric insulating properties. The aramid non-woven fabric has largest degree of porosity as unmeasured by the ASTM-D726.

Preferred flexible sheet of the present invention comprises a resin sheet prepared by impregnating a heat- and/or light-curable resin into an aramide non-woven fabric made from 97 to 20% by weight of chopped fibers consisting predominantly of an aromatic polyamide or copolyamide and 3 to 80% by weight of a binder, followed by curing the resin-impregnated sheet, said chopped fibers of an aromatic polyamdie or copolyamide consisting of (a) chopped fibers of a polymer comprising predominantly an aromatic homopolyamide or copolyamide wherein the bonding chain extends from the aromatic ring in uniaxial or parallel axial direction and (b) chopped fibers of an aromatic homopolyamide or copolyamide other than the polymer of the chopped fibers (a) and the ratio of (a)/(b) (by weight) being in the range of 0/100 to 100/0, preferably 10/90 to 100/0.

The polymer comprising predominantly an aromatic homopolyamide or copolyamide wherein the bonding chain extends from the aromatic ring in uniaxial or parallel axial direction [designated as polymer (A)] includes the following polymers.

The term that the bonding chain extends from the aromatic ring in uniaxial or parallel axial direction means, for example, the following cases:

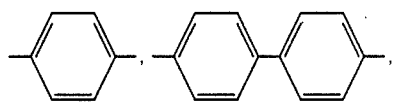

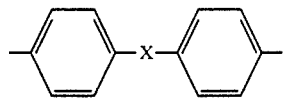

(where X is —O—, —S—,

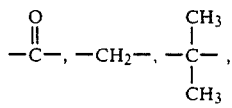

etc.),

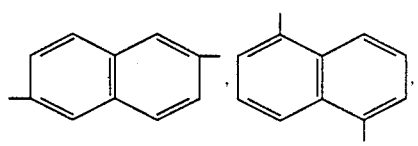

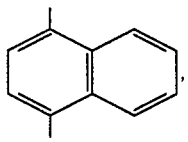

and the like. These aromatic rings may optionally have a substituent, such as a halogen atom, an alkyl having 1 to 3 carbon atoms, and phenyl.

Suitable examples of the polymer (A) are poly(p-benzamide), poly(p-phenylene terephthalamide), poly(2-chloro-p-phenylene terephthalamide), poly(p-phenylene-2,6-naphthalenedicarbonamide), poly(1,5-naphthylene terephthalamide), poly(4,4'-biphenylene ether terephthalamide), poly(p,p'-phenylene benzamide), poly(p-benzamide/p-phenylene terephthamide) (50/50 copolymer).

The polymer (A) is aromatic homo- or copolyamide which contains bonds extending from each aromatic ring in uniaxial or parallel axial direction in an amount of 50% by mole or more, preferably 80% by mole or more, based on the whole bonds. These polymers are used in the form of a homopolymer alone, a copolymer alone, a mixture of two or more kinds of homopolymers, a mixture of a homopolymer and a copolymer, and a mixture of two or more kinds of copolymers.

The polymer comprising predominantly an aromatic homopolyamide or copolyamide other than the polymer of the chopped fibers (a) [designated as polymer (B)] includes, for example, poly(m-benzamide), poly(m-phenylene isophthalamide), poly(m,m'-phenylene benzamide), poly(1,6-naphthylene isophthalamide), and the like.

The polymer (B) is aromatic homo- or copolyamide which contains bonds extending from each aromatic ring in uniaxial or parallel axial direction in an amount of less than 50% by mole, preferably less than 30% by mole, based on the whole bonds. These polymers are used in the form of a homopolymer alone, a copolymer alone, a mixture of two or more kinds of homopolymers, a mixture of a homopolymer and a copolymer, and a mixture of two or more kinds of copolymers.

The aromatic polyamides or copolyamides used in the present invention may be prepared by a conventional method such as solution polycondensation method or interfacial polymerization method of an aromatic dicarboxylic acid halide and an aromatic diamine.

The fibers of the aromatic polyamide or copolyamide may be prepared by a coventional wet spinning method or dry spinning method.

The chopped fibers (a) and (b) of the aromatic polyamides have a fiber fineness of 0.5–10 deniers, preferably 1–5 deniers, and a cutting length of 3–100 mm, preferably 5–80 mm.

The chopped fibers contained in the aramide nonwoven fabric contain 97 to 20% by weight of chopped fibers consisting predominantly of an aromatic polyamide or copolyamide which consist of (a) chopped fibers of a polymer comprising predominantly an aromatic homopolyamide or copolyamide wherein the bonding chain extends from the aromatic ring in uniaxial or parallel axial direction and (b) chopped fibers of an aromatic homopolyamide or copolyamide other than the polymer of the chopped fibers (a) wherein the ratio of (a)/(b) (by weight) is in the range of 0/100 to 100/0. Preferred ratio of (a)/(b) is in the range of 10/90 to 100/0 by weight. When the ratio of the chopped fibers (b) is over 90% by weight and the ratio of the chopped fibers (a) is less than 10% by weight, the aramide nonwoven fabric and the resin-impregnated sheet show less heat dimensional stability.

Whole of the chopped fibers (a) and (b) are contained in the ratio of 97 to 20% by weight based on the whole weight of the aramide non-woven fabric. When the chopped fibers are contained in an amount of over 97% by weight (the binder being in an amount of less than 3% by weight), the non-woven fabric shows insufficient strength, and on the other hand, when the amount of the chopped fibers is less than 20% by weight (the binder being in an amount of over than 80% by weight), the non-woven fabric has lower heat dimensional stability and inferior impregnation of the resin.

The aramide non-woven fabric of the present invention may optionally be incorporated with chopped fibers of other synthetic resins, glass chopped fibers or ceramic chopped fibers, unless they undesirably affect on the object and effects of the present invention. These other chopped fibers may preferably be used in an amount of not more than 40% by weight. Moreover, the non-woven fabric may optionally be subjected to surface treatment or application of a lubricant in order to improve the compatibility with resins or to make easier handling of fibers in the production and processing steps.

The resin to be impregnated into the aramide nonwoven fabric in the present invention is a heat- and/or light-curable resin and/or resin composition.

The heat-curable resin means resins or compounds which can increase the molecular weight or can be crosslinked by heating due to chemical reaction, and compositions of these resins or compounds. The chemical reaction induced by heating includes radical reaction, ionic reaction, addition reaction, condensation reaction, substitution reaction, dehydrogenation reaction, oxidation reaction, and the like.

Examples of the resins, compounds or compositions thereof are phenol resins, furan resins, xylylene resins, formaldehyde/ketone resins, urea resins, melamine resins, aniline resins, sulfonamide resins, alkyd resins, unsaturated polyester resins, epoxy resins, triallylcyanulate resins, diallylphthalate resins, polybutadiene resins, bismaleimide resins, epoxy resin/acrylonitrilebutadiene copolymer composition, epoxy resin/polyamide resin, phenol resin/polyvinylbutyral resin, polyester resin/isocyanate compound, unsaturated polyester/vinyl monomer, polyester resin/isocyanate compound/epoxy compound, and the like. There are usually used conventional catalyst and curing agent for promoting the curing reaction.

The resin curable with a light (e.g. visual light, ultraviolet, electron rays) means resins or compounds which can increase the molecular weight or can be crosslinked by heating due to chemical reaction induced by absorption of light energy, and compositions of these resins or compounds. The reaction induced by the light irradiation includes radical reaction, ionic reaction, dehydrogenation reaction, addition reaction, oxidation and reduction reaction, and the like. The light-curable resins and composition thereof comprise usually a light sensitive group or compound, a reagent being capable of reacting in chain reaction (e.g. diluent, crosslinking agent), a sensitizer which can promote the light reaction, and a polymer which participates or does not participate to the light reaction.

The light-reactive resins may be classified by the light sensitive groups, and suitable examples are the compounds having a diazo group as the light sensitive group (e.g. diazonium compounds, quinonediazides, etc.): compounds containing an azide group as the light sensitive group: compounds containing a cinnamoyl group as the light sensitive group: and compounds containing an acryloyl group as the light sensitive group. There may also be used a light sensitive initiator, wherein the curing is effected by producing a radical or ion by means of light irradiation and thereby polymerizing a conventional radical reactive monomer or ion reactive monomer. By this method, unsaturated polyester resins and epoxy resins can be cured. Besides, by dehydrogenation reaction or by utilizing a radical produced by cleavage of bond or unsaturated bond, there may also be cured a polymer having a structure which has usually been considered to be unreactive, such as polyethylene chain.

Preferred resin compositions are a composition containing a polyfunctional acrylic compound/polyester resin/benzophenone sensitizer, and a composition containing a polyfunctional acrylic compound/unsaturated polyester resin/benzoin sensitizer.

The heat- and/or light-curable resins used in the present flexible sheet should have excellent electric properties, flexibility, chemical resistance, solvent resistance, water resistance, heat resistance, soldering resistance, and adhesion to metals. In order to obtain desired resin compositions having well balanced properties of the above, it is preferable to combine at least each one of the following two groups of resins. They may merely be mixed, but preferably, both resins are bonded by chemical reaction.

First group includes polyfunctional epoxy compounds, polyfunctional isocyanate compounds, phenol/formalin condensates, resorsinol/formalin condensates, melamine/formalin condensates, xylene/formalin condensates, alkylbenzene/formalin condensates, unsaturated polyesters, polyfunctional allyl compounds (e.g. diallyl phthalate, triallyl (iso)cyanurate, etc.), polyfunctional (meth)acrylic compounds (e.g. imide compounds containing epoxyacrylate or urethanacarylate, amidoimide compounds, etc.), and the like. Preferred compounds are polyfunctional epoxy compounds, polyfunctional isocyanate compounds, phenol/formalin condensates, unsaturated polyesters, and diallylphthalate resins.

Second group includes polyolefinic resins (e.g. polyisobutyrene, etc.), polyvinyl resins (e.g. polyvinyl chloride, polyacrylic esters, polyvinyl acetate, polyvinylformalin, polyvinyl acetal, polyvinyl butyral, etc.), rubbery resins (e.g. polyisoprene, polybutadiene, chlorosulfonated polyethylene, poly(epichlorohydrin), polychloroprene, etc.), silicone resins, fluorine resins, and the like. There are also included copolymers of these resins, for example, acrylonitrile/butadiene copolymer, acrylonitrile/butadiene/styrene copolymer, ethylene/vinyl acetate copolymer, vinyl chloride/vinyl acetate copolymer, ethylene/acrylic ester copolymer, and the like. There are also included polyester resins, polyamide resins, polyether resins, polycarbonates, phenoxy resins, as well as copolymers of these resins. Usually, these resins selected from the first group and the second group are used in a composition thereof and a reaction mixture thereof, but there may be used a monomer mixture and/or a partial reaction product which is firstly impregnated into the aramid non-woven fabric and then polymerized and/or crosslinked.

Preferred combinations of the resins are epoxy resin/acrylonitrile-butadiene copolymer, epoxy resin/acrylic acid-acrylic ester copolymer, phenol-formalin condensate/polybutyral resin, isocyanate compound/polyester resin, isocyanate compound/epoxy compound/polyester resin, isocyanate compound/epoxyacrylate resin/polyester resin, unsaturated polyester/vinyl monomer, and the like.

In the resin composition, the resin of the first group and the resin of the second group are usually combined in a ratio of 80/20 to 10/90 (by weight). When the resin of the first group is used in an amount of over 90% by weight, the product shows disadvantageously inferior folding endurance, and on the other hand, when the amount is less than 10% by weight, the product shows disadvantageously inferior soldering resistance, solvent resistance, and chemical resistance. In the resin composition and/or reaction product used in the present invention, both components have preferably functional groups which can mutually react, but in order to promote the reaction, there may usually be used a curing agent or curing catalyst.

The reaction proceeds usually by a molecular chain extending reaction and an intramolecular crosslinking reaction in the resin per se of the first group, in the resin per se of the second group and/or between the resin of the first group and the resin of the second group, by which the crosslinked structure is formed. The degree of the crosslinking is usually expressed by a partial raio of insoluble part (gel fraction) in a solvent (a solvent for dissolving the resins or resin compositions before the crosslinking reaction). The flexible sheet in the present invention has a gel fraction of not less than 10%, preferably not less than 50%, particularly preferably not less than 70%. Since the insoluble part contains the components of the aramide non-woven fabric, the weight of the insoluble material of the aramide non-woven fabric is previously measured, and then, the weight of the insoluble resin excluding the weight of the insoluble components of the aramide non-woven fabric is calculated, based on which there is calculted the ratio of the weight of insoluble resin to the weight of resin before crosslinking (the weight of the non-woven fabric in the sheet being also excluded).

In a preferred embodiment, there is provided a flexible sheet which is prepared by impregnating a heat- and/or light-curable resin into an aramide non-woven fabric, curing the resin-impregnated non-woven fabric by heat and/or light and crosslinking the cured product until reaching to 10% or more of the gel fraction, wherein said heat- and/or light curable resin being a resin composition containing a polyester resin prepared by polymerizing (i) 70 to 30% by mole of an aliphatic dicarboxylic acid having 4 to 10 carbon atoms and/or an aliphatic hydroxycarboxylic acid having 4 to 10 carbon atoms as the acid component and/or (ii) 30 to 100% by mole of an aliphaic glycol having 4 to 10 carbon atoms as the alcoholic component.

The acid component used for the prepartion of the above polyester resin includes aromatic dicarboxylic acids (e.g. terephthalic acid, isophthalic acid, orthophthalic acid, 2,6-naphthalenedicarboxylic acid, phenylenediacetic acid, etc.), aliphatic dicarboxylic acids (e.g. succinic acid, adipic acid, azelaic acid, sebacic acid, dodecanedicarboxylic acid, dimeric acid, nonamethylenecarboxylic acid, decamethylenedicarboxylic acid, etc.), trifunctional or more polyfunctional carboxylic acids (e.g. trimellitic acid, pyromellitic acid, ethylene glycol bistrimellitate, neopentyl glycol bistrimellitate, etc.), hydroxycarboxylic acids (e.g. p-hydroxybenzoic acid, etc.), and further, aromatic hydroxycarboxylic acid alkylene oxide adducts (e.g. p-hydroxybenzoic acid alkylene oxide adducts, m-hydroxybenzoic acid alkylene oxide adducts, etc.).

The aliphatic dicarboxylic acid having 4 to 10 carbon atoms includes succinic acid, glutaric acid, adipic acid, pimelic acid, suberic acid, azelaic acid, sebacic acid, undecanedicarboxylic acid, dodecanedicarboxylic acid, and the like.

The alcoholic component includes divalent aliphatic alcohols (e.g. ethylene glycol, propylene glycol, 1,4-butanediol, 1,5-pentanediol, neopentyl glycol, 1,6-hexanediol, etc.), trivalent or more polyvalent liphatic alcohols (e.g. glycerin, trimethylolethane, trimethylolpropane, pentaerythritol, etc.), alicyclic glycols (e.g. 1,4-cyclohexanedimethanol, 1,3-cyclohexanedimethanol, etc.), and aromatic glycols (e.g. bisphenol A alkylene oxide adducts, p-hydroxybenzoic acid alkylene oxide adducts, hydroquinone ethylene oxide adduct, bisphenol A, hydroquinone, resorcinol, etc.).

The aliphatic glycol having 4 to 10 carbon atoms used in the present invention includes 1,4-butanediol, 1,2-pentanediol, neopentyl glycol, 1,4-hexanediol, 2,4-dimethyl-2,4-pentanediol, 2,5-dimethyl-2,5-hexanediol, hexamethyltrimethylene glycol, and the like.

Preferred examples of the polyester resins used in the present invention are the following polyester resins:

(A) a polyester resin comprising as the acid component 70 to 30% by mole of an aliphatic dicarboxylic acid having 4 to 12 carbon atoms and/or an aliphatic hydoxycarboxylic acid having 4 to 12 carbon atoms, 30 to 70% by mole of an aromatic dicarboxylic acid and 0 to 5% by mole of a trifunctional or more polyfunctional carboxylic acid and as an alcoholic component 95 to 100% by mole of an aliphatic glycol having 2 to 10 carbon atoms, an alicyclic glycol and/or an aromatic glycol and 0 to 5% by mole of a trifunctional or more polyfunctional alcohol, (B) a polyester resin comprising as the acid component 30 to 100% by mole of an aromatic dicarboxylic acid, 0 to 70% by mole of an aliphatic dicarboxylic acid having 4 to 12 carbon atoms and/or an aliphatic hydoxycarboxylic acid having 4 to 12 carbon atoms and 0 to 5% by mole of a trifunctional or more polyfunctional carboxylic acid and as an alcoholic component 30 to 100% by mole of an aliphatic glycol having 4 to 10 carbon atoms, 70 to 0% by mole of an alicyclic glycol and/or an aromatic glycol and 0 to 5% by mole of a trifunctional or more polyfunctional alcohol, and (C) a polyester resin comprising as the acid component 70 to 30% by mole of an aliphatic dicarboxylic acid having 4 to 12 carbon atoms and/or an aliphatic hydoxycarboxylic acid having 4 to 12 carbon atoms, 30 to 70% by mole of an aromatic dicarboxylic acid and 0 to 5% by mole of a trifunctional or more polyfunctional carboxylic acid and as an alcoholic component 30 to 100% by mole of an aliphatic glycol having 4 to 10 carbon atoms and 0 to 5% by mole of a trifunctional or more polyfunctional alcohol.

When the amount of the aliphatic dicarboxylic acid having 4 to 12 carbon atoms and/or aliphatic hydroxycarboxylic acid having 4 to 12 carbon atoms is over 70% by mole, the product shows inferior heat resistance (soldering resistance) and chemical resistance, and on the other hand, when it is less than 30% by mole, the product shows inferior flexibility of the resin.

In case of the alcoholic component consisting of 95 to 100% by mole of an aliphatic glycol having 2 to 10 carbon atoms, an alicyclic glycol and/or an aromatic glycol and 0 to 5% by mole of a trifunctional or more polyfunctional alcohol, when the amount of the aliphatic dicarboxylic acid having 4 to 12 carbon atoms and/or an aliphatic hydoxycarboxylic acid having 4 to 12 carbon atoms is over 70% by mole, the resin becomes too soft, and hence, the product shows inferior solvent resistance, and when the amount of the aromatic dicarboxylic acid is over 70% by mole, the resin shows inferior solubility in solvent and inferior flexibility. When the trifunctional or more polyfunctional carboxylic acid is copolymerized, the resin shows improved crosslinking properties which is effective on the increase of gel fraction.

In case of the acid component consisting of 30 to 100% by mole of an aromatic dicarboxylic acid, 0 to 70% by mole of an aliphatic dicarboxylic acid having 4 to 12 carbon atoms and/or an aliphatic hydoxycarboxylic acid having 4 to 12 carbon atoms and 0 to 5% by mole of a trifunctional or more polyfunctional carboxylic acid, when the amount of the aliphatic glycol having 4 to 10 carbon atoms is less than 30% by mole, the resin shows inferior flexibility, while the heat resistance thereof may be improved.

In the present invention, the above polyester resin is impregnated into an aramide non-woven fabric, and the resin is cured by heat and/or light, and thereby, the resin is crosslinked till the gel fraction becomes 10% or more.

The curing agent for the polyester resin includes isocyanate compounds, acid anhydrides, epoxy compounds and the like. These are incorporated in the ratio of polyester resin/isocyanate compound/epoxy compound = 70/10/20 (% by weight). There may also be incorporated with other additives such as acid anhydride (e.g. trimellitic anhydride), polymerization initiator (e.g. benzoyl peroxide, benzophenone, etc.) in order to imporve more the curing of the resin.

The resin composition used in the present invention may also be incorporated with other additives, such as lubricants (e.g. silica, talc, silicone, etc.), adhesion promoters, fire retardants (e.g. halogen compounds, phosphorus compounds, aluminum hydroxide, antimony trioxide, etc.), stabilizers (e.g. antioxidants, ultraviolet absorbers, polymerization inhibitors, etc.), releasing agents (e.g. silicone compounds, fluoro compounds, and inorganic compounds), plating activators, and inorganic or organic fillers (e.g. talc, titanium oxide, fine particles of fluoropolymer, pigments, dyestuffs, calcium carbonate, etc.).

The flexible sheet of the present invention can be prepared in the following manner. A resin solution is impregnated into the above-mentioned non-woven fabric, and optionally drying the solvent, and then, the resin is cured. For the purpose of laminating a metal foil thereon without using any adhesive, or for the purpose of laminating a covering layer onto a printed circuit board without using any adhesive, the lamination is carried out with heating and under pressure when the impregnated non-woven fabric has still adhesion, and thereafter, the resin is cured to give the desired sheet having excellent properties. The polyester resin should be crosslinked till the gel frction becomes 10% or more.

Alternatively, instead of impregnating a resin into an aramide nonwoven fabric, the desired resin-impregnated sheet may be prepared by forming a sheet consisting of a solid resin, and then inserting the sheet between aramide non-woven fabrics, followed by heating under pressure to make impregnated the resin into the aramide non-woven fabrics.

The impregnation of the resin composition into the aramide non-woven fabric can be carried out at one time or at a plural times with a conventional horizontal or vertical impregnating machine. It may also be carried out by a coating method, for instance, by coating the resin composition from one side of the aramide non-woven fabric and optionally also from the opposite side.

After the impregnation or coating, the resin can be dried in a usual manner. When the resin-impregnated sheet is tacky, there may be used a releasing sheet at any step. The releasing sheet may be any one of a conventional cellulose paper or film to which a releasing agent is applied, or a conventional polypropylene film, polyvinyl alcohol film, polyester film, and the like.

The flexible sheet of the present invention may further be laminated with a metal layer. The lamination of the metal layer may be carried out via a resin adhesive, but may be done without using any adhesive, i.e. by laminating directly a metal foil to the resin-impregnated sheet before the sheet is completely cured, followed by curing the resin. Alternatively, the lamination of metal layer may also be effected by physical metallizing or chemical metallizing, or by applying partially a metallizing resist and then forming thereon a metal layer by chemical metallizing or optionally by electrical metallizing. The metal for the metal layer includes copper, aluminum, nickel, and the like. The metal-clad laminate thus prepared may further be laminated with another flexible sheet reinforced with an aramide nonwoven fabric of the present invention.

According to the present invention, there can be prepared a very thin sheet, and hence, the sheet has excellent flexibility. The flexible sheet reinforced with one aramide non-woven fabric has usually a thickness of $20\mu$ to $200\mu$, preferably $30\mu$ to $100\mu$. A plural of the resin-impregnated sheets may be laminated, but from the viewpoint of flexibility, a thin layer sheet is favorable. In case of a metal-clad laminate, the metal layer has a thickness of about $2\mu$ to $100\mu$, preferably about $9\mu$ to $40\mu$.

The curing of the resin may be carried out by ultraviolet irradiation or by heating. When the curing is done by irradiation of too much ultraviolet or too much heating at one time, the sheet is badly affected in the appearance and physical properties, and hence, the curing is preferably carried out by an irradiation amount of ultraviolet in the range of 0.5 to 10 $J/cm^2$ and by heating at a temperature of from 50° C. to 150° C.

The flexible printed circuit board of the present invention is formed by forming a circuit pattern on at least one surface of the flexible sheet of the present invention. The formation of circuit pattern can be carried out by any conventional processes, such as an additive process, subtractive process (etched foil process). In case of the subtractive process, the base sheet (i.e. the flexible sheet) and a metal foil (e.g. copper foil, aluminum foil, nickel foil, etc.) are firstly laminated to give a laminated sheet, wherein the base sheet and the metal foil may be laminated via an adhesive, or alternatively, a base sheet having adhesion is laminated with the metal foil without using any adhesive.

Specifically, the flexible printed circuit board can be prepared, for example, by preparing a resin-impregnating sheet by impregnating a heat- and/or light-curable resin into an aramide non-woven fabric, followed by curing the resin, and then laminating thereon a metal foil which is applied with a resin composition, and optionally curing the resultant, and then forming a circuit pattern on the resulting metal-clad laminate by a conventional method.

In case of a flexible printed circuit board wherein the flexible sheet of the present invention is used as a covering layer, the flexible sheet is laminated on the circuit pattern of the flexible printed circuit board as prepared above. The flexible printed circuit board with cirucuit pattern as used in the above process is not limited to the flexible printed circuit board obtained by using the flexible sheet of the present invention but may be any conventional flexible printed circuit boards. When the flexible sheet of the present invention is used as a covering layer as mentioned above, the lamination may be carried out by using an adhesive or without using any adhesive.

The aramide non-woven fabric used for the flexible sheet, metal-clad laminate and flexible printed circuit board of the present invention has a comparatively low density, and hence, can be impregnated well with a resin. Accordingly, the flexible printed circuit board prepared by using the flexible sheet of the present invention can eliminate the defects of the conventional flexible printed circuit boards laminated with an aramide paper, such as (i) carling, (ii) bad water resistance, (iii) inferior insulating properties due to penetration of agents into the aramide paper, and (iv) low dielectric break-down voltage through thick direction due to voids.

Moreover, the aramide non-woven fabric used in the present invention has specific mass per unit area and specific density, and hence, there can be obtained a flexible sheet having a thin thickness and containing a very small amount of resin to be impregnated, which is effective on the improvement of the folding endurance of the flexible printed circuit board. It is also possible to laminate a plural resin-impregnated sheets. Besides, the resin composition contains both hard component and soft component in a suitable amount and further is crosslinked, and hence, the flexible printed circuit board prepared therefrom shows excellent heat resistance and excellent folding endurance.

The flexible sheet of cured polymer reinforced by a non-woven fabric of the present invention has excellent dimensional stability, folding endurance, electric insulating properties and heat resistance which are particularly required for the electric insulating layer in the flexible printed circuit board.

The polyester resin used in the present invention is prepared by copolymerizing an acid component and/or alcohol component having 4 to 10 carbon atoms, and hence, the resin has improved flexibility in comparison with the conventional polyester resin. Besides, the heat resistance and solvent resistance are improved by increasing the gel fraction due to crosslinkage of the polyester resin or between the polyester resin and other resin composition by using trifunctional or more polyfunctional groups. In order to give improved heat resistance and solvent resistance, the gel fraction should be 10% or more, preferably 50% or more, more preferably 80% or more. When the gel fraction is less than 10%, the resin shows disadvantageously inferior heat resistance (soldering resistance) and inferior chemical resistance (resistance to etching liquid, metallizing liquid, resist releasing liquid, etc.).

When a conventional polyester resin is cured with an epoxy compound or isocyanate compound, the resin shows improved heat resistance and chemical resistance in comparison with the polyester resin alone, but the resin becomes disadvantageously hard. On the contrary, when the polyester resin as used in the present invention is cured likewise, the resin shows advantageously improved flexibility as well as excellent heat resistance and chemical resistance. Besides, by using a fiber reinforcement having excellent heat resistance, the resin composition is released from change in dimension under heating and shows improved heat resistance (soldering resistance at 260° C.).

The present invention is illustrated by the following Examples. The measurements and procedures used in Examples are done as follows.

(1) Formation of circuit pattern is carried out by the following steps:

(i) a circuit pattern is printed with a ultraviolet-curable etching resist ink [UER 110 (blue), manufactured by Toyo Boseki K. K.] on the copper surface of a copper-clad sheet by using a 300 mesh screen of polyester fiber, (ii) the printed sheet is irradiated with a high pressure mercury arc lamp at a rate of 700 mJ/cm$^2$ to cure the above resist, (iii) the resulting sheet is subjected to etching with a ferric chloride solution (38°-40° Be) at 40° C. for 100 seconds, (iv) the etching resist is released with 4 wt.% aqueous sodium hydroxide solution, and (v) the resultant is washed with water and then dried.

(2) Electrical insulating resistance:

According to the formation method of circuit pattern in the above (1), there is prepared a test pattern of a circuit width of 1.0 mm, a circuit distance of 1.0 mm and a circuit length of 25 mm which is provided with a land for electrically connecting (round shape having a diameter of 5 mm). A direct electric current at 500 V is applied both ends of the test pattern for 1 minute, and then the electric resistance is measured, by using a high insulating resistance meter 4329 A (manufactured by Yokogawa Hewlett-Pachard Co.).

(3) Dielectric breakdown voltage:

To the same pattern as used in the measurement of electrical insulating resistance as above (2), alternating current (0.2 mA) is applied, and then the voltage of breakdown of the insulation is measured by using a break-down voltage and insulating automatic tester (MODEL MS-5, manufactured by Kokuyo Denki Kogyo K. K.).

(4) Peel strength of copper foil:

In the same manner as in the formation of circuit pattern as the above (1), a copper foil pattern (width: 1 mm, length: 100 mm) is formed in the longitudinal direction. The peel strength of the copper foil is measured by peeling at 90° at a draw rate of 50 mm/minute with IPC FC241 by using a peel strength tester (Tensilone UTM-II, manufactured by Toyo Seiki K. K.).

(5) Folding endurance:

In the same manner as in the formation of circuit pattern as the above (1), a copper foil pattern (width: 2 mm) is formed at the middle of a base plate (width: 15 mm) in the longitudinal direction. The folding endurance is measured by MIT method (JIS P8115) at a load of 500 g and R=0.8 mm by counting the times until the foil is cut by detecting electrically.

(6) Heat shrinkage (rate of change of dimension):

According to IPC FC241 C process, the heat shrinkage is measured before and after the treatment at 150° C. for 30 minutes. (only the shrinkage in the longitudinal direction of the copper-clad sheet is shown)

(7) Soldering resistance:

According to the process as defined in JIS C6481, there are observed the blistering, delamination or color change by using Solder-Light MH 820V (manufactured by Tamura Kagaku Kenkyusho) as a post flux.

(8) Weight per unit area:

It is measured by the process as defined in JIS P8124.

(9) Apparent density:

The thickness is measured by the process as defined in JIS P-8118, and the apparent density [$\rho$ (g/cm$^3$)] is calculated by the following formula:

$$\rho = \frac{W}{t}$$

wherein t means thickness ($\mu$m), and W means the weight per unit area (g/cm$^2$).

(10) Gel fraction (%):

A cured resin composition (1 g) is heated in a mixed solvent (25 ml) of phenol/sym.-tetrachloroethane (60/40 by weight) at 120° C. for 2 hours, and the undissolved materials are separated by filtration with No. 2 glass filter. The undissolved materials are washed with the above mixed solvent and then with chloroform, and dried. Based on the weight of the undissolved materials, the ratio of the gel (undissolved part) is calculated.

There are listed aramide non-woven fabrics (abbreviated as ANW) used in the following Examples 1–7 and Reference Examples 1–4 in Table 1.

TABLE 1

| No. of ANW | Mixed ratio (wt.) Aramide chopped fiber | Binder | Weight per unit area (g/m$^2$) | Apparent density (g/cm$^3$) | Ex. No. to be used |
|---|---|---|---|---|---|
| ANW-1 | ARC-1 (70) | ARF-1 (20) PTC-1 (10) | 15 | 0.37 | Ex. 1 |
| ANW-2 | ARC-1 (70) | ARF-1 (20) PTC-1 (10) | 25 | 0.37 | Ex. 2 |
| ANW-3 | ARC-1 (70) | ARF-1 (20) PTC-1 (10) | 4 | 0.38 | Ref. Ex. 1 |
| ANW-4 | ARC-1 (70) | ARF-1 (20) PTC-1 (10) | 15 | 0.10 | Ref. Ex. 2 |
| ANW-5 | ARC-1 (70) | ARF-1 (20) PTC-1 (10) | 40 | 0.40 | Ref. Ex. 3 |
| ANW-6 | ARC-1 (70) | ARF-1 (20) PTC-1 (10) | 25 | 1.0 | Ref. Ex. 4 |
| ANW-7 | ARC-3 (40) ARC-2 (40) | PTC-2 (20) | 25 | 0.50 | Ex. 3 |
| ANW-7 | ARC-3 (40) ARC-2 (40) | PTC-2 (20) | 25 | 0.50 | Ex. 4 |
| ANW-7 | ARC-3 (40) ARC-2 (40) | PTC-2 (20) | 25 | 0.50 | Ex. 5 |

TABLE 1-continued

| No. of ANW | Mixed ratio (wt.) Aramide chopped fiber | Binder | Weight per unit area (g/m$^2$) | Apparent density (g/cm$^3$) | Ex. No. to be used |
|---|---|---|---|---|---|
| ANW-8 | ARC-3 (80) | PTC-2 (20) | 25 | 0.44 | Ex. 6 |

The starting materials shown in Table 1:
(1) Aramide chopped fibers:
ARC-1: Chopped fibers of poly(m-phenylene isophthalamide), 2 deniers, cutting length 6 mm
ARC-2: Chopped fibers of poly(m-phenylene isophthalamide), 2 deniers, cutting length 38 mm
ARC-3: Chopped fibers of poly(p-phenylene terephthalamide), 1.5 deniers, cutting length 6 mm
ARC-4: Chopped fibers of poly(p-phenylene terephthalamide), 1.5 deniers, cutting length 38 mm
(2) Binder:
ARF-1: Poly(m-phenylene isophthalamide) fibrides
PTC-1: Chopped fibers of polyethylene terephthalate, 1.1 deniers, cutting length 6 mm
PTC-2: Chopped fibers of polyethylene terephthalate, 5 deniers, cutting length 38 mm

EXAMPLE 1

A saturated polyester copolymer resin (Vylon 560, manufactured by Toyo Boseki K. K.) (13.0 kg), isophorone diisocyanate trimer (iPDi T1890, manufactured by VEBA CHEMIE Co.) (3.0 kg), an epoxy resin (YDB-400, manufactured by Toto Kasei K. K.) (4.6 kg), a curing catalyst ($C_{11}Z$, manufactured by Shikoku Kasei K. K., 400 g, and KS1260, manufactured by Kyodo Yakuhin K. K., 6 g), and antimony trioxide (600 g) are dissolved in toluene (20.0 kg) and methyl ethyl ketone (5.0 kg) to prepare a resin solution. The solution is impregnated into aramide non-woven fabric ANW-1 as shown in Table 1 with a vertical impregnation machine, and the resin-impregnated non-woven fabric is dried at 60° C. for 2 minutes and further at 100° C. for 2 minutes to give an aramide non-woven fabric sheet impregnated with resin (resin deposition amount: 65 g/m$^2$).

Separately, The above resin solution is coated onto an electrically deposited copper foil (35μ) (TSTO-HD foil, manufactured by Furukawa Circuit Foil Co.) and dried to give a resin-coated copper foil (resin coating amount: 20 g/m$^2$ in dry). The copper foil is laminated with the above resin-impregnated aramide non-woven fabric at 135° C. under 38 kg/cm by roll lamination and then cured at 80° C. for 12 hours and further at 145° C. for 16 hours to give a copper-clad flexible sheet of cured polymer reinforced by an aramide non-woven fabric (thickness: 125μ). By using the copper-clad flexible sheet, a flexible printed circuit board is prepared. The properties of the circuit board are shown in Table 2.

EXAMPLE 2

In the same manner as described in Example 1 except that ANW-2 is used instead of the aramide non-woven fabric ANW-1 in Example 1, there is prepared a copper-clad flexible sheet of cured polymer reinforced by an aramide non-woven fabric (thickness: 140μ). By using the copper-clad flexible sheet, a flexible printed circuit board is prepared. The properties of the circuit board are shown in Table 2.

REFERENCE EXAMPLE 1

It is tried to prepare a resin-impregnated sheet in the same manner as described in Example 1 by using ANW-3 instead of the aramide non-woveb fabric ANW-1 in Example 1, but it is impossible because the sheet is broken during the preparation step.

REFERENCE EXAMPLES 2, 3 and 4

In the same manner as described in Example 1 except that ANW-4, ANW-5 and ANW-6 are each used instead of the aramide non-woven fabric ANW-1 in Example 1, there are prepared copper-clad flexible sheets of cured polymer reinforced by an aramide non-woveb fabric. By using the copper-clad flexible sheets, there are prepared flexible printed circuit hoards. The properties of the circuit boards are shown in Table 2.

TABLE 2

| | | Example 1 | Example 2 | Ref. Ex. 1 | Ref. Ex. 2 | Ref. Ex. 3 | Ref. Ex. 4 |
|---|---|---|---|---|---|---|---|
| Weight per unit area (g/m$^2$) | | 15 | 25 | 4 | 15 | 40 | 25 |
| Apparent density (g/cm$^3$) | | 0.37 | 0.37 | 0.38 | 0.10 | 0.40 | 1.0 |
| Moldability | | Good | Good | Impossible | Poor impregnation* | Poor impregnation* | Not impregnated into mass |
| Electrical insulating resistance (Ω) | Before treatment | $6.5 \times 10^{13}$ | $7.4 \times 10^{13}$ | — | $5.5 \times 10^{13}$ | $5.8 \times 10^{13}$ | $7.3 \times 10^{13}$ |
| | After treatment by boiling water | $2.8 \times 10^{13}$ | $2.1 \times 10^{13}$ | — | $1.1 \times 10^{12}$ | $8.9 \times 10^{12}$ | $5.1 \times 10^{12}$ |
| Copper foil peel strength (g/mm) | Before treatment | 226 | 248 | — | 286 | 292 | 140 |
| | After treatment by boiling water | 201 | 223 | — | 230 | 255 | 92 |
| Folding endurance (times) | | 65 | 53 | — | 11 | 15 | 42 |
| Heat shrinkage (%) | | 0.26 | 0.20 | — | 0.36 | 0.14 | 0.47 |
| Dielectric breakdown voltage (KV/mm) | | 35 | 32 | — | 29 | 25 | 20 |
| Soldering resistance (260° C. × 20 sec.) | | OK | OK | — | OK | OK | OK |

*There are many bubbles within the resin layer of the copper-clad flexible sheet.

EXAMPLE 3

An epoxy resin (BREN S, manufactured by Nippon Kayaku K. K.) (6.0 kg), nitrile butadiene rubber (Nipol 1001B, manufactured by Nippon Zeon K. K.) (4.0 kg), and a curing catalyst (2E4MZ: 2-ethyl-4-methylimidazole, manufactured by Shikoku Kasei K. K.) (0.2 kg) are dissolved in methyl ethyl ketone (10.0 kg) to prepare a resin solution. The solution is impregnated into aramide non-woven fabric ANW-7 as shown in Table 1 with a vertical impregnation machine, and the resin-impregnated non-woven fabric is dried at 60° C. for 2 minutes and further at 100° C. for 2 minutes to give an aramide non-woven fabric sheet impregnated with resin (resin deposition amount: 68 g/m$^2$).

Separately, The above resin solution is coated onto an electrically deposited copper foil (35μ) (JTC foil, manufactured by Nippon Kogyo K. K.) and dried to give a resin-coated copper foil (resin coating amount: 20 g/m$^2$ in dry). The copper foil is laminated with the above resin-impregnated sheet at 150° C. under 37 kg/cm by roll lamination and then cured at 100° C. for 16 hours to give a copper-clad flexible sheet of cured polymer reinforced by an aramide non-woven fabric (thickness: 128μ). By using the copper-clad flexible sheet, a flexible printed circuit board is prepared. The properties of the circuit board are shown in Table 3.

EXAMPLE 4

A saturated polyester copolymer resin (Vylon 5500, manufactured by Toyo Boseki K. K.) (6.5 kg), isophorone diisocyanate trimer (iPDi T1890, manufactured by VEBA CHEMIE Co.) (1.5 kg), an epoxy resin (YDB-400, manufactured by Toto Kasei K. K.) (5.5 kg), a curing catalyst (C$_{11}$Z, manufactured by Shikoku Kasei K. K., 0.3 kg, and KS1260, manufactured by Kyodo Yakuhin K. K., 3 g), and antimony trioxide (0.5 kg) are dissolved in toluene (8.0 kg) and methyl ethyl ketone (2.0 kg) to prepare a resin solution The solution is impregnated into aramide non-woven fabric ANW-7 as shown in Table 1 with a vertical impregnation machine, and the resin-impregnated non-woven fabric is dried at 60° C. for 2 minutes and further at 100° C. for 2 minutes to give an aramide non-woven fabric sheet impregnated with resin (resin deposition amount: 60 g/m$^2$).

Separately, The above resin solution is coated onto an electrically deposited copper foil (35μ) (JTC foil, manufactured by Nippon Kogyo K. K.) and dried to give a resin-coated copper foil (resin coating amount: 20 g/m$^2$ in dry). The copper foil is laminated with the above resin-impregnated sheet at 135° C. under 38 kg/cm by roll lamination and then cured at 80° C. for 12 hours and further at 145° C. for 12 hours to give a copper-clad flexible sheet of cured polymer reinforced by an aramide non-woven fabric (thickness: 120μ). By using the copper-clad flexible sheet, a flexible printed circuit board is prepared. The properties of the circuit board are shown in Table 3.

EXAMPLE 5

A saturated polyester copolymer resin (terephthalic acid/isophthalic acid/maleic acid/sebacic acid//ethylene glycol/hexamethylene glycol=20/20/30/30//50/50; acid components 100%//glycolcomponents 100%, wherein the % means molar % of the unsaturated polyester composing unit) (5.0 kg), tetrahydrofurfuryl acrylate (THF-A, manufactured by Kyoeisha Yushi Kogyo K. K.) (2.0 kg), 2-hydroxy-3-phenoxypropyl acrylate (M-600A, manufactured by Kyoeisha Yushi Kogyo K. K.) (2.0 kg), tetraethylene glycol diacrylate (4EG-A, manufactured by Kyoeisha Yushi Kogyo K. K.) (1.0 kg), and a catalyst (di-t-butyl di-peroxyphthalate, 0.3 kg, and benzophenone, 0.2 kg) are dissolved in methyl ethyl ketone (6.0 kg) to prepare a resin solution. By using the resin solution, there are prepared a copper-clad flexible sheet of cured polymer reinforced by an aramide non-woven fabric and then a flexible printed circuit board in the same manner as described in Example 4. The properties of the circuit board are shown in Table 3.

TABLE 3

| | | Example 3 | Example 4 | Example 5 |
|---|---|---|---|---|
| Weight per unit area (g/m$^2$) | | 25 | 25 | 25 |
| Apparent density (g/cm$^3$) | | 0.50 | 0.50 | 0.50 |
| Electrical insulating resistance (Ω) | Before treatment | 4.7 × 10$^{13}$ | 1.5 × 10$^{14}$ | 7.8 × 10$^{12}$ |
| | After treatment by boiling water | 9.2 × 10$^{11}$ | 3.0 × 10$^{12}$ | 1.0 × 10$^{12}$ |
| Copper foil peel strength (g/mm) | Before treatment | 219 | 184 | 274 |
| | After treatment by boiling water | 153 | 170 | 205 |
| Folding endurance (times) | | 51 | 49 | 43 |
| Heat shrinkage (%) | | 0.01 | −0.01 | −0.01 |
| Soldering resistance (260° C. × 20 sec.) | | OK | OK | OK |

EXAMPLE 6

In the same manner as described in Example 1 except that ANW-8 is used instead of the aramide non-woven fabric ANW-1 in Example 1, there is prepared a copper-clad flexible sheet of cured polymer reinforced by an aramide non-woven fabric, and by using the copper-clad flexible sheet, a flexible printed circuit board is prepared. The properties of the circuit board are shown in Table 4.

EXAMPLE 7

In the same manner as described in Example 6 except that the aramide non-woven fabric ANW-8 is merely impregnated with a resin, followed by drying, there is prepared a resin-impregnated sheet reinforced by an aramide non-woven fabric (disposition amount of the resin: 50 g/m$^2$). This resin-impregnates sheet is laminated onto whole face of circuit pattern of the printed circuit board as prepared in Example 6 by pressing at 130° C. under 20 kg/cm$^2$ for 5 minutes with a heat pressing machine, and then cured at 145° C. for 16 hours. The properties of the resulting flexible printed circuit board are measured, which are shown in Table 4.

TABLE 4

| | | Example 6 | Example 7 |
|---|---|---|---|
| Weight per unit area (g/m$^2$) | | 25 | 25 25 |
| Apparent density (g/cm$^3$) | | 0.50 | 0.50 0.50 |
| Electrical insulating resistance (Ω) | Before treatment | 7.3 × 10$^{13}$ | 1.4 × 10$^{14}$ |
| | After treatment by boiling water | 5.0 × 10$^{13}$ | 2.1 × 10$^{13}$ |
| Copper foil peel strength (g/mm) | Before treatment | 260 | — |
| | After treatment by boiling water | 189 | — |
| Folding endurance (times) | | 36 | 82 |
| Heat shrinkage (%) | | 0.01 | — |
| Soldering resistance (260° C. × 20 sec.) | | OK | OK |

The aramide non-woven fabric (ANW) used in Examples 8–13 are shown in Table 5.

TABLE 5

| No. of ANW | Mixed ratio (wt.) Aramide chopped fiber** | Binder | a/b* | wt. % of binder | Weight per unit area (g/m$^2$) | Apparent density (g/cm$^3$) | Ex. No. to be used |
|---|---|---|---|---|---|---|---|
| ANW-9 | ARC-4 (80) (a) | PTC-2 (20) | 100/0 | 20 | 25 | 0.57 | Ex. 8 |

TABLE 5-continued

| No. of ANW | Mixed ratio (wt.) | | | wt. % of binder | Weight per unit area (g/m²) | Apparent density (g/cm³) | Ex. No. to be used |
|---|---|---|---|---|---|---|---|
| | Aramide chopped fiber** | Binder | a/b* | | | | |
| ANW-10 | ARC-4 (40) (a) ARC-2 (40) (b) | PCT-2 (20) | 50/50 | 20 | 26 | 0.54 | Ex. 9 |
| ANW-11 | ARC-4 (8) (a) | PTC-2 (20) | 10/90 | 20 | 25 | 0.56 | Ex. 10 Ex. 12 |
| ANW-12 | ARC-4 (60) (a) | PTC-2 (40) | 100/0 | 40 | 24 | 0.60 | Ex. 11 |
| ANW-13 | ARC-3 (35) (a) ARC-1 (35) (b) | ARF-1 (20) PTC-1 (10) | 50/50 | 30 | 15 | 0.41 | Ex. 13 |

*Ratio by weight of the aramide chopped fiber (a) and the aramide chopped fiber (b)
**The aramide chopped fibers are as defined in Table 1.

EXAMPLE 8

A saturated polyester copolymer resin (Vylon 560, manufactured by Toyo Boseki K. K.) (13.0 kg), isophorone diisocyanate trimer (iPDi T1890, manufactured by VEBA CHEMIE Co.) (3.0 kg), an epoxy resin (YDB-400, manufactured by Toto Kasei K. K.) (4.6 kg), a curing catalyst ($C_{11}Z$, manufactured by Shikoku Kasei K. K., 6 g), and antimony trioxide (600 g) are dissolved in toluene (20.0 kg) and methyl ethyl ketone (5.0 kg) to prepare a resin solution. The solution is impregnated into aramide non-woven fabric ANW-9 as shown in Table 5 with a vertical impregnation machine, and the resin-impregnated non-woven fabric is dried at 60° C. for 2 minutes and further at 100° C. for 2 minutes to give an aramide non-woven fabric sheet impregnated with resin (resin deposition amount: 60 g/m²).

Separately, The above resin solution is coated onto an electrically deposited copper foil (35μ) (TSTO-HD foil, manufactured by Furukawa Circuit Foil Co.) and dried to give a resin-coated copper foil (resin coating amount: 26 g/m² in dry). The copper foil is laminated with the above resin-impregnated aramide non-woven fabric at 135° C. under 38 kg/cm by roll lamination and then cured at 80° C. for 12 hours and further at 145° C. for 16 hours to give a copper-clad flexible sheet of cured polymer reinforced by an aramide non-woven fabric (thickness: 125μ). By using the copper-clad flexible sheet, a flexible printed circuit board is prepared. The properties of the circuit board are shown in Table 6.

EXAMPLE 9

In the same manner as described in Example 8 except that ANW-10 is used instead of the aramide non-woven fabric ANW-9 in Example 8, there is prepared a copper-clad flexible sheet of cured polymer reinforced by an aramide non-woven fabric (thickness: 128μ). By using the copper-clad flexible sheet, a flexible printed circuit board is prepared. The properties of the circuit board are shown in Table 6.

EXAMPLE 10

In the same manner as described in Example 8 except that ANW-11 is used instead of the aramide non-woven fabric ANW-9 in Example 8, there is prepared a copper-clad flexible sheet of cured polymer reinforced by an aramide non-woven fabric (thickness: 124μ). By using the copper-clad flexible sheet, a flexible printed circuit board is prepared. The properties of the circuit board are shown in Table 6.

EXAMPLE 11

In the same manner as described in Example 8 except that ANW-12 is used instead of the aramide non-woven fabric ANW-9 in Example 8, there is prepared a copper-clad flexible sheet of cured polymer reinforced by an aramide non-woven fabric (thickness: 120μ). By using the copper-clad flexible sheet, a flexible printed circuit board is prepared. The properties of the circuit board are shown in Table 6.

EXAMPLE 12

An epoxy resin (Epicote 154, manufactured by Yuka Shell Epoxy K. K.) (6.0 kg), nitrile butadiene rubber (Nipol 1001B, manufactured by Nippon Zeon K. K.) (4.0 kg), and a curing catalyst (2E4MZ: 2-ethyl-4-methylimidazole, manufactured by Shikoku Kasei K. K.) (0.2 kg) are dissolved in methyl ethyl ketone (10.0 kg) to prepare a resin solution. The solution is impregnated into aramide non-woven fabric ANW-11 as shown in Table 5 with a vertical impregnation machine, and the resin-impregnated non-woven fabric is dried at 60° C. for 2 minutes and further at 100° C. for 2 minutes to give an aramide non-woven fabric sheet impregnated with resin (resin deposition amount: 68 g/m²).

Separately, The above resin solution is coated onto an electrically deposited copper foil (35μ) (JTC foil, manufactured by Nippon Kogyo K. K.) and dried to give a resin-coated copper foil (resin coating amount: 20 g/m² in dry). The copper foil is laminated with the above resin-impregnated sheet at 150° C. under 37 kg/cm by roll lamination and then cured at 100° C. for 16 hours to give a copper-clad flexible sheet of cured polymer reinforced by an aramide non-woven fabric (thickness: 125μ). By using the copper-clad flexible sheet, a flexible printed circuit board is prepared. The properties of the circuit board are shown in Table 6.

EXAMPLE 13

A saturated polyester copolymer resin (terephthalic acid/maleic acid/sebacic acid//ethylene glycol/hexamethylene glycol=40/30/30//50/50: acid components 100%//glycol components 100%, wherein the % means molar % of the unsaturated polyester composing unit) (5.0 kg), tetrahydrofurfuryl acrylate (THF-A, manufactured by Kyoeisha Yushi Kogyo K. K.) (2.0 kg), 2-hydroxy-3-phenoxypropyl acrylate (M-600A, manufactured by Kyoeisha Yushi Kogyo K. K.) (2.0 kg), tetraethylene glycol diacrylate (4EG-A, manufactured by Kyeisha Yushi Kogyo K. K.) (1.0 kg), and a catalyst (di-t-butyl di-peroxyphthalate, 0.3 kg, and benzophenone, 0.2 kg) are dissolved in methyl ethyl ketone (6.0 kg) to prepare a resin solution. The solution is impregnated into aramide non-woven fabric ANW-13 as shown in Table 5 with a vertical impregnation machine, and the resin-impregnated non-woven fabric is dried at 60° C. for 2 minutes and further at 100° C. for 2 minutes to give an aramide non-woven fabric sheet impregnated with resin (resin deposition amount: 63 g/m²).

Separately, The above resin solution is coated onto an electrically deposited copper foil (35μ) (T-5B HD foil, manufactured by Fukuda Kinzokuhakufun Kogyo K. K.) and dried to give a resin-coated copper foil (resin coating amount: 20 g/m² in dry). The copper foil is laminated with the above resin-impregnated aramide non-woven fabric at 150° C. under 37 kg/cm by roll lamination and then cured at 80° C. for 12 hours and further at 145° C. for 12 hours to give a copper-clad flexible sheet of cured polymer reinforced by an aramide non-woven fabric. By using the copper-clad flexible sheet, a flexible printed circuit board is prepared. The properties of the circuit board are shown in Table 6.

TABLE 6

|  | Ex. 8 | Ex. 9 | Ex. 10 | Ex. 11 | Ex. 12 | Ex. 13 |
| --- | --- | --- | --- | --- | --- | --- |
| Aramide non-woven fabric* | ANW-9 | ANW-10 | ANW-11 | ANW-12 | ANW-11 | ANW-13 |
| Moldability | Good | Good | Good | Good | Good | Good |
| Electrical insulating resistance (Ω) | $7.2 \times 10^{13}$ | $8.6 \times 10^{13}$ | $6.9 \times 10^{13}$ | $1.8 \times 10^{14}$ | $5.1 \times 10^{12}$ | $6.7 \times 10^{12}$ |
| Copper foil peel strength (g/mm) | 351 | 330 | 349 | 365 | 243 | 184 |
| Folding endurance (times) | 42 | 54 | 71 | 50 | 84 | 69 |
| Heat shrinkage | 0.01 | 0.07 | 0.16 | 0.20 | 0.19 | 0.22 |
| Soldering resistance (260° C. × 20 sec.) | OK | OK | OK | OK | OK | OK |

*To be referred to Table 5

EXAMPLE 14

Both faces of the resin-impregnated sheet reinforced by an aramide non-woven fabric as prepared in Example 8 are laminated with a release paper at 135° C. under 38 kg/cm by roll lamination, and cured at 80° C. for 12 hours and further at 145° C. for 16 hours to give a flexible sheet having a heat shrinkage of 0.01%.

Molding of test samples (used in Examples 15 to 19) is carried out in the following manner.

A resin solution is impregnated into an aramide paper [poly(m-phenylene isophthalamide fibrous binder (ARF-1): 30 parts by weight, poly(m-phenylene isophthalamide chopped fiber (2 deniers, cutting length, 6 mm) (ARC-1): 70 parts by weight, mass per unit area: 15 g/m²] and then dried to give a resin-impregnated dry sheet.

A release sheet (Teflon-impregnated glass cloth sheet) and an electrically deposited copper foil (35μ) (TSTO-HD, manufactured by Furukawa Circuit Foil Co.) are introduced onto a calender roll heated at about 100° C., where the release face of the release sheet is laminated with the electrically deposited copper foil via the resin-impregnated dry sheet as prepared above, while keeping a fixed distance between the rolls. After the lamination, the release sheet is peeled off from the laminate to give a copper-clad laminate reinforced by an aramide paper. The laminate (at the copper-clad side) is attached on a roll heated at 130° C., and then the resin-impregnated sheet is exposed to light irradiation with a high pressure mercury arc lamp at a rate of 3–7 J/cm² (measured in 365 mm), by which precrosslinking is effected. Thereafter, it is further crosslinked and cured at 80° to 150° C. in a hot air dryer.

The polyester resins used in Examples 15 to 23 are as shown in Table 7.

TABLE 7

|  | Saturated polyester resin[1] (molar ratio) | Intrinsic viscosity (dl/g) |
| --- | --- | --- |
| A | T/S = 70/30<br>E/N = 50/50 | 0.543 |
| B | T/I/AZ = 50/21/29<br>E/N = 60/40 | 0.649 |
| C | T/I/AA/TMA = 27/28/54/1<br>E/N = 45/55 | 0.715 |
| D | T/I/AZ/TMA = 27/18/54/1<br>E/N = 45/55 | 1.26 |
| E | T/I/TMA = 52/47/1<br>E/1,6 HD = 35/65 | 0.320 |

Note:
[1]T: Terephthalic acid
AZ: Azelaic acid
AA: Adipic acid
E: Ethylene glycol
1,6 HD: 1,6-Hexanediol
I: Isophthalic acid
S: Sebacic acid
TMA: Trimellitic acid
N: Neopentyl glycol

EXAMPLES 15–19

The above polyester resins A to E (each 70 parts by weight) are each mixed with an epoxy resin (Epicote 828, manufactured by Yuka Shell Epoxy Co.) (20 parts by weight), an isocyanate compound (IPDI-T1890S, manufactured by VEBA CHEMIE Co.) (10 parts by weight), an epoxy curing agent (Curezol $C_{11}Z$, manufactured by Shikoku Kasei K. K.) 2 parts by weight) and a light radical initiator (benzophenone) (1 part by weight) and the mixture is diluted in 30–50 wt.% with methyl ethyl ketone/toluene (20/80 by weight) to give a resin solution. In the same manner as described above, an aramide non-woven fabric is impregnated with the above resin solution and cured likewise to give a resin-impregnated flexible sheet. By using the flexible sheet, there is prepared a copper-clad laminate likewise. The properties of the copper-clad laminate are shown in Table 8.

TABLE 8

| Ex. No. | Polyester resin | Gel fraction (%) | Rate of change of dimension (%) | Folding endurance | Soldering resistance |
| --- | --- | --- | --- | --- | --- |
| Ex. 15 | A | 84.3 | 0.26 | 36.5 | Normal |
| Ex. 16 | B | 82.6 | 0.22 | 39.7 | Normal |
| Ex. 17 | C | 94.5 | 0.25 | 34.2 | Normal |
| Ex. 18 | D | 91.6 | 0.28 | 61.3 | Normal |
| Ex. 19 | E | 93.3 | 0.26 | 58.5 | Normal |

EXAMPLES 20-21

The above polyester resins C and E (each 80 parts by weight) are each mixed with an isocyanate compound (IPDI-T1890S) (20 parts by weight), a curing catalyst (dibutyl tin dilaurate) (0.05 part by weight) and a heat polymerization initiator (di-cumyl peroxide) (2 parts by weight) and the mixture is diluted in 30-50 wt.% with methyl ethyl ketone/toluene (20/80 by weight) to give a resin solution. In the same manner as described above, an aramide non-woven fabric is impregnated with the above resin solution and cured likewise to give a resin-impregnated flexible sheet. By using the flexible sheet, there is prepared a copper-clad laminate likewise. The properties of the copper-clad laminate are shown in Table 9.

TABLE 9

| Ex. No. | Polyester resin | Gel fraction (%) | Rate of change of dimension (%) | Folding endurance | Soldering resistance |
| --- | --- | --- | --- | --- | --- |
| Ex. 20 | C | 92.4 | 0.22 | 48.5 | Normal |
| Ex. 21 | E | 90.8 | 0.24 | 74.8 | Normal |

EXAMPLE 23

The resin solutions as prepared in Examples 17 and 19 are each coated onto a releasing polyethylene terephthalate film with a hand applicator (300μ) and cured at 80°-150° to give a film (thickness: 170μ). The film is cut in a size of 1.5 cm × 15 cm. The properties of the test sample thus prepared are tested in a room (20° C., 65% relative humidity) with Instron type universal tester (UTM-III, manufactured by Toyo Boldwine Co.) (length of sample: 30 mm, crosshead speed: 30 mm/minute). The results are shown in Table 10.

TABLE 10

| Polyester resin | Young's modulus (kg/mm$^2$) | Elongation (%) |
| --- | --- | --- |
| C | 175.0 | 1.5 |
| E | 18.3 | 108.0 |

EXAMPLE 24

In the same manner as described in Example 1 except that the saturated polyester resin A is used instead of the saturated copolymer resin (Vylon 560), there is prepared a copper-clad flexible sheet of cured polymer reinforced by an aramide non-woven fabric, and by using the copper-clad flexible sheet, a flexible printed circuit board is prepared. The properties of the circuit board are shown in Table 11.

TABLE 11

|  |  | Example 24 |
| --- | --- | --- |
| Weight per unit area (g/m$^2$) |  | 15 |
| Apparent density (g/cm$^3$) |  | 0.26 |
| Moldability |  | Good |
| Electrical insulating resistance (Ω) | Before treatment | $7.0 \times 10^{13}$ |
|  | After treatment by boiling water | $9.9 \times 10^{12}$ |
| Copper foil peel strength (g/mm) | Before treatment | 214 |
|  | After treatment by boiling water | 207 |
| Folding endurance (times) |  | 36.5 |
| Heat shrinkage (%) |  | 0.26 |
| Dielectric breakdown voltage (KV/mm) |  | 30 |
| Soldering resistance (260° C. × 20 sec.) |  | OK |

The polyester resins used in the present invention are prepared by copolymerizing acid components having 4 to 12 carbon atoms and alcohol components having 4 to 10 carbon atoms, and hence, they have improved flexibility, which is effective on improvement of folding endurance in a copper-clad laminate which is suitable for preparing a flexible printed circuit board, flat cable or carrier tape for integrated circuit. For instance, when it is used together with an epoxy resin, the folding endurance is lowered. Besides, when an isocyanate compound is added thereto, the crosslinking properties are more improved, and hence, the product shows improved heat resistance and chemical resistance.

Thus, the polyester resins used in the present invention can show satisfactory crosslinking properties and flexibility which are equired to a polyester resin for the preparation of a flexible printed circuit board.

Besides, by specifying the mass per unit area and density of the aramide non-woven fabric, there can be prepared a flexible sheet wherein a resin is completely impregnated, and hence, it can give the desired flexible printed circuit board having well balanced properties, such as excellent heat resistance, flexibility and dimension stability (due to the aramide non-woven fabric) and improved water resistance which is improved by the sufficient impregnation of a resin.

What is claimed is:

1. A flexible sheet which comprises a non-woven fabric made from 60% by weight or more of a poly(aromatic amide) component which is impregnated with a heat- and/or light-curable resin, wherein the non-woven fabric satisfies the following conditions:

5 g/m$^2$ < weight per unit area < 35 g/cm$^2$, and
0.15 g/cm$^3$ ≦ density ≦ 0.8 g/cm$^3$ said poly(aromatic amide) component comprising chopped fibers of an aromatic homopolyamide or copolyamide composed of the following units:

—HN—R$_1$—NHOCR$_2$CO—,     formula (1)

or

—HN—R$_3$—CO—     formula (2)

wherein R$_1$, R$_2$, and R$_3$ are each substituted or unsubstituted aromatic group selected from

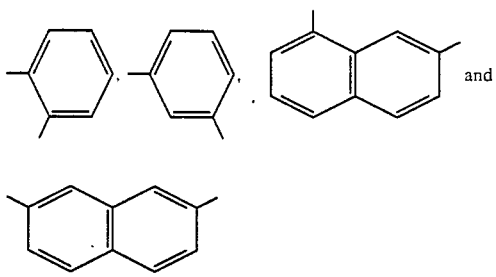

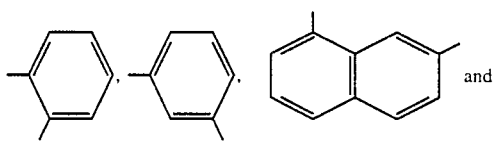

and any substituent on the aromatic group is a member selected from the group consisting of an alkyl having 1 to 3 carbon atoms, chlorine atom, bromine atom and phenyl.

2. The flexible sheet of claim 1 wherein said non-woven fabric is made from 97 to 20% by weight of said chopped fibers consisting predominantly of aromatic polyamide or copolyamide and from 3 to 80% by weight of binder.

3. The flexible sheet of claim 1 wherein said chopped fibers consist of chopped fibers of a polymer selected from the group consisting of poly(m-benzamide), poly(m-phenylene isophthalamide), poly(m,m'-phenylene benzamide), and poly(1,6-naphthylene isophthalamide).

4. The flexible sheet of claim 3, wherein said chopped fibers consist of poly(m-phenylene isophthalamide) chopped fibers.

5. A flexible metal-clad laminate which comprises a metal layer and a base sheet, said base sheet comprising a non-woven fabric made from 60% by weight or more of a poly(aromatic amide) component which is impregnated with a heat- and/or light-curable resin, wherein the non-woven fabric satisfies the following conditions:

5 g/m$^2$ < weight per unit area < 35 g/cm$^2$, and
0.15 g/cm$^3$ ≦ density ≦ 0.8 g/cm$^3$, said poly(aromatic amide) component comprising chopped fibers of an aromatic homopolyamide or copolyamide composed of the following unit:

$$-HN-R_1-NHOCR_2CO-, \qquad \text{formula (1)}$$

or $$-HN-R_3-CO- \qquad \text{formula (2)}$$

wherein $R_1$, $R_2$ and $R_3$ are each substituted or unsubstituted aromatic group selected from

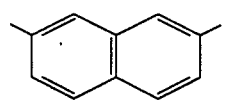

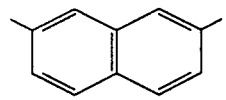

and any substituent on the aromatic group is a member selected from the group consisting of an alkyl having 1 to 3 carbon atoms, chlorine atom, bromine atom and phenyl.

6. The flexible metal-clad laminate of claim 5 wherein said non-woven fabric is made from 97 to 20% by weight of said chopped fibers consisting predominantly or aromatic polyamide or copolyamide and from 3 to 80% by weight of binder.

7. In a flexible printed circuit board wherein a flexible sheet is used as a base sheet and/or a covering layer, the improvement which comprises that the flexible sheet comprises a non-woven fabric made from 60% by weight or more of a poly(aromatic amide) component which is impregnated with a heat- and/or light-curable resin, wherein the non-woven fabric satisfies the following conditions:

5 g/m$^2$ < weight per unit area < 35 g/cm$^2$, and
0.15 g/cm$^3$ ≦ density ≦ 0.8 g/cm$^3$, said poly(aromatic amide) component comprising chopped fibers of an aromatic homopolyamide or copolyamide composed of the following unit:

$$-HN-R_1-NHOCR_2CO-, \qquad \text{formula (1)}$$

or $$-HN-R_3-CO- \qquad \text{formula (2)}$$

wherein $R_1$, $R_2$ and $R_3$ are each substituted or unsubstituted aromatic group selected from

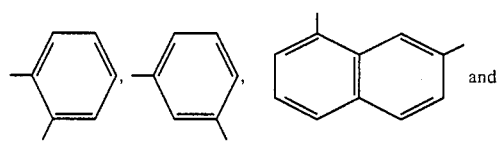

and any substituent on the aromatic group is a member selected from the group consisting of an alkyl having 1 to 3 carbon atoms, chlorine atom, bromine atom and phenyl.

8. The flexible printed circuit board of claim 7 wherein said non-woven fabric is made from 97 to 20% by weight of said chopped fibers consisting predominantly of aromatic polyamide or copolyamide and from 3 to 80% by weight of binder.

* * * * *